US012646823B2

(12) United States Patent
Kim et al.

(10) Patent No.: US 12,646,823 B2
(45) Date of Patent: Jun. 2, 2026

(54) ANTENNA MODULE AND DISPLAY DEVICE INCLUDING THE SAME

(71) Applicants:SAMSUNG DISPLAY CO., LTD., Yongin-si (KR); UNIST (ULSAN NATIONAL INSTITUTE OF SCIENCE AND TECHNOLOGY), Ulsan (KR)

(72) Inventors: Ki Seo Kim, Yongin-si (KR); Gangil Byun, Busan (KR); Jin Woo Kim, Yongin-si (KR); Jae Uk Choi, Yongin-si (KR); Hae Chan Chong, Ulsan (KR); Jin Myeong Heo, Uslan (KR)

(73) Assignees: SAMSUNG DISPLAY CO., LTD., Yongin-si (KR); UNIST (ULSAN NATIONAL INSTITUTE OF SCIENCE AND TECHNOLOGY, Ulsan (KR)

( * ) Notice: Subject to any disclaimer, the term of this patent is extended or adjusted under 35 U.S.C. 154(b) by 421 days.

(21) Appl. No.: 18/492,935

(22) Filed: Oct. 24, 2023

(65) Prior Publication Data

US 2024/0283135 A1      Aug. 22, 2024

(30) Foreign Application Priority Data

Feb. 21, 2023     (KR) ........................ 10-2023-0023065

(51) Int. Cl.
| | |
|---|---|
| *H01Q 1/24* | (2006.01) |
| *H10K 59/80* | (2023.01) |
| *H10K 102/10* | (2023.01) |

(52) U.S. Cl.
CPC ........... *H01Q 1/243* (2013.01); *H10K 59/805* (2023.02); *H10K 2102/10* (2023.02)

(58) Field of Classification Search
None
See application file for complete search history.

(56) References Cited

U.S. PATENT DOCUMENTS

| | | | |
|---|---|---|---|
| 11,538,889 | B2 | 12/2022 | Kim et al. |
| 2016/0093939 | A1 | 3/2016 | Kim et al. |

(Continued)

FOREIGN PATENT DOCUMENTS

| | | |
|---|---|---|
| EP | 3817134 | 5/2021 |
| EP | 4120474 A1 | 1/2023 |

(Continued)

OTHER PUBLICATIONS

Park, et al., "An Optically Invisible Antenna-on-Display (AoD) Concept for Millimeter-wave 5G Cellular Devices", in IEEE Transactions on Antennas and Propagation, DOI 10.1109/TAP.2019. 2900399, pp. 1-12.

(Continued)

*Primary Examiner* — Cory W Eskridge
(74) *Attorney, Agent, or Firm* — F. CHAU & ASSOCIATES, LLC

(57) ABSTRACT

According to an embodiment, a display device may include a display panel including a display area for displaying images and a non-display area arranged at edges of the display area, an antenna layer disposed on the display panel and including a first area corresponding to the display area, a second area corresponding to the non-display area, and a protruding area protruding from the second area in a first direction. The first direction is a direction away from the display panel, and an antenna driver circuit electrically connected to the antenna layer through an antenna pad disposed in the protruding area. The antenna layer may include a feeder electrode disposed on at least a portion of the second area, a reflector electrode disposed between the feeder electrode and the protruding area in the second area, (Continued)

and a plurality of director electrodes arranged in at least a portion of the first area such that they are spaced apart from one another.

20 Claims, 16 Drawing Sheets

(56)                    References Cited

U.S. PATENT DOCUMENTS

| | | | |
|---|---|---|---|
| 2020/0163204 A1* | 5/2020 | Kim | H01Q 1/44 |
| 2021/0328364 A1* | 10/2021 | Jia | H01Q 1/523 |
| 2022/0102864 A1* | 3/2022 | Morimoto | H01Q 1/3291 |
| 2022/0208861 A1 | 6/2022 | Oh et al. | |
| 2022/0352620 A1 | 11/2022 | Morimoto et al. | |
| 2023/0039020 A1* | 2/2023 | Lee | H01Q 1/523 |
| 2023/0130657 A1* | 4/2023 | Kim | H01Q 21/08 |
| | | | 343/700 R |
| 2023/0134528 A1 | 5/2023 | Kim et al. | |
| 2024/0072441 A1* | 2/2024 | Wada | H01Q 5/371 |
| 2024/0120667 A1* | 4/2024 | Oh | H01Q 21/065 |

FOREIGN PATENT DOCUMENTS

| | | |
|---|---|---|
| KR | 10-2021-0052749 | 11/2021 |
| KR | 10-2022-0066033 | 5/2022 |
| KR | 10-2022-0097703 | 7/2022 |

OTHER PUBLICATIONS

Raveendra, et al., "A Multiband Substrate Integrated Waveguide Antenna for Ku-band and K-band Applications", in 6th International Conference for Convergence in Technology (12CT), Pune, India. Apr. 2-4, 2021, DOI:10.1109/12CT51068.2021.9418198, pp. 1-4.

Extended European Search Report dated Jun. 25, 2024 in corresponding European Patent Application No. 24157767.5 (6 pages).

* cited by examiner

SIW : FL, GND1, GND2, GV
700 : 710, 720, 730
720 : 721, 722
730 : 731, 732, 733, 734

SIW : FL, GND1, GND2, GV
700 : 710, 720, 730
720 : 721, 722
730 : 731, 732, 733, 734

ANTL : 1600, M1, M2, M3

ANTENNA MODULE AND DISPLAY DEVICE INCLUDING THE SAME

CROSS REFERENCE TO RELATED APPLICATION

This application claims priority from Korean Patent Application No. 10-2023-0023065 filed on Feb. 21, 2023 in the Korean Intellectual Property Office, the disclosure of which is incorporated herein by reference in its entirety.

FIELD OF THE DISCLOSURE

The present disclosure relates generally to an antenna module and a display device including the same.

DISCUSSION OF THE RELATED ART

As the "information society" evolves, various demands for display devices are ever increasing. For example, display devices are employed by a variety of electronic devices such as smart phones, digital cameras, laptop computers, navigation devices, and smart televisions.

A display device may include an antenna that transmits and receives electromagnetic (EM) waves for wireless communications. For example, a display device may include an embedded antenna for fourth-generation (4G) mobile communications such as long-term evolution (LTE) and/or fifth-generation (5G) mobile communications. Different frequency bands of EM waves are used for different communication technologies. The shape and/or length of an antenna may vary depending on the frequency band of the EM waves.

SUMMARY

Aspects of the present disclosure provide an antenna module supporting wireless communications by forming an antenna electrode in a non-display area, and a display device including the same.

Aspects of the present disclosure also provide an antenna module that can be easily miniaturized by including a Yagi-Uda antenna and can increase transmission and reception efficiency for wireless communications due to high radiation gain.

According to an embodiment of the present disclosure, a display device may include a display panel including a display area for displaying images and a non-display area arranged at edges of the display area, an antenna layer disposed on the display panel and including a first area corresponding to the display area, a second area corresponding to the non-display area, and an protruding area protruding from the second area in a first direction. The first direction is direction away from the display panel, and an antenna driver circuit electrically connected to the antenna layer through an antenna pad disposed in the protruding area. The antenna layer may include a drive element (feeder) electrode disposed on at least a portion of the second area, a reflector electrode disposed between the driven element electrode and the protruding area in the second area, and a plurality of director electrodes arranged in at least a portion of the first area such that they are spaced apart from one another by a predetermined distance.

The antenna pad may be disposed at one end of the protruding area in the antenna layer. The protruding area may include a conductive path electrically connecting the antenna pad with the driven element electrode. The conductive path may be implemented as a substrate integrated waveguide.

The conductive path may include a feed line configured to supply power to the driven element electrode, and a first ground line and a second ground line disposed on both sides of the feed line, respectively.

The reflector electrode may include a first reflector electrode disposed between one side of the driven element electrode and the first ground line, and a second reflector electrode disposed between an opposite side of the driven element electrode and the second ground line.

A center of each of the plurality of director electrodes may be located on a straight line extended from the feed line.

A center of each of the plurality of director electrodes may be located on a straight line inclined by a predetermined angle from the driven element electrode.

The predetermined angle may have a range of +15 degrees to 15 degrees with respect to a straight line extended from the feed line.

The director electrodes may have an equal length in a second direction perpendicular to the first direction.

Some electrodes selected from among the director electrodes may have an equal length in a second direction perpendicular to the first direction.

The director electrodes may have different lengths in a second direction perpendicular to the first direction. The director electrodes may include a first director electrode having a first length in the second direction, and a second director electrode disposed between the first director electrode and the driven element electrode and having a second length longer than the first length in the second direction.

Each of the director electrodes may include a transparent electrode having a mesh structure.

Each of the director electrodes may include a plurality of slots, and each of the plurality of slots overlaps with a pixel arranged in the display panel in a thickness direction of the display panel.

The transparent electrode of each of the director electrodes may be disposed such that it does not overlap with a pixel arranged in the display panel.

The antenna layer may include a transparent dielectric substrate disposed on the display panel, and the driven element electrode, the reflector electrode and the director electrodes may be disposed on an upper surface of the transparent dielectric substrate.

A ground electrode may be disposed on a lower surface of the transparent dielectric substrate.

According to an embodiment of the present disclosure, an antenna module disposed inside a display device may include a transparent dielectric substrate disposed on a display panel of the display device, and an antenna electrode disposed on an upper surface of the transparent dielectric substrate. The antenna electrode may include a driven element (feeder) electrode and a reflector electrode each overlapping a non-display area of the display panel in a thickness direction of the display panel, and a plurality of director electrodes overlapping a display area of the display panel in the thickness direction.

The transparent dielectric substrate may include a first area overlapping with the display area, a second area overlapping with the non-display area, and a protruding area protruding from the second area in direction away from the display panel and may include an antenna pad. A conductive path for supplying power to the driven element electrode may be disposed on the protruding area of the transparent dielectric substrate.

The conductive path may be implemented as a substrate integrated waveguide.

A center of each of the plurality of director electrodes may be located on a straight line extended from the feed line of the conductive path.

A center of each of the plurality of director electrodes may be located on a straight line inclined by a predetermined angle from the driven element electrode.

According to embodiments of the present disclosure, it is possible to support wireless communications by forming an antenna electrode in a non-display area of a display device.

In addition, according to embodiments of the present disclosure, it is possible to design an antenna module that can be easily miniaturized by including a Yagi-Uda antenna and to increase transmission and reception efficiency for wireless communications due to high radiation gain.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF EMBODIMENTS

Embodiments of the present inventive concept will now be described more fully hereinafter with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the claimed subject matter to those skilled in the art. The same reference numbers indicate the same components throughout the specification.

It will also be understood that when a layer is referred to as being "on" another layer or substrate, it can be directly on the other layer or substrate, or intervening layers may also be present. When the layer is illustrated or described as physically contacting the other layer or substrate, this provides an example of the layer being "directly on" the other layer or substrate.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the inventive concept. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Hereinafter, specific embodiments will be described with reference to the accompanying drawings.

Figure 1:
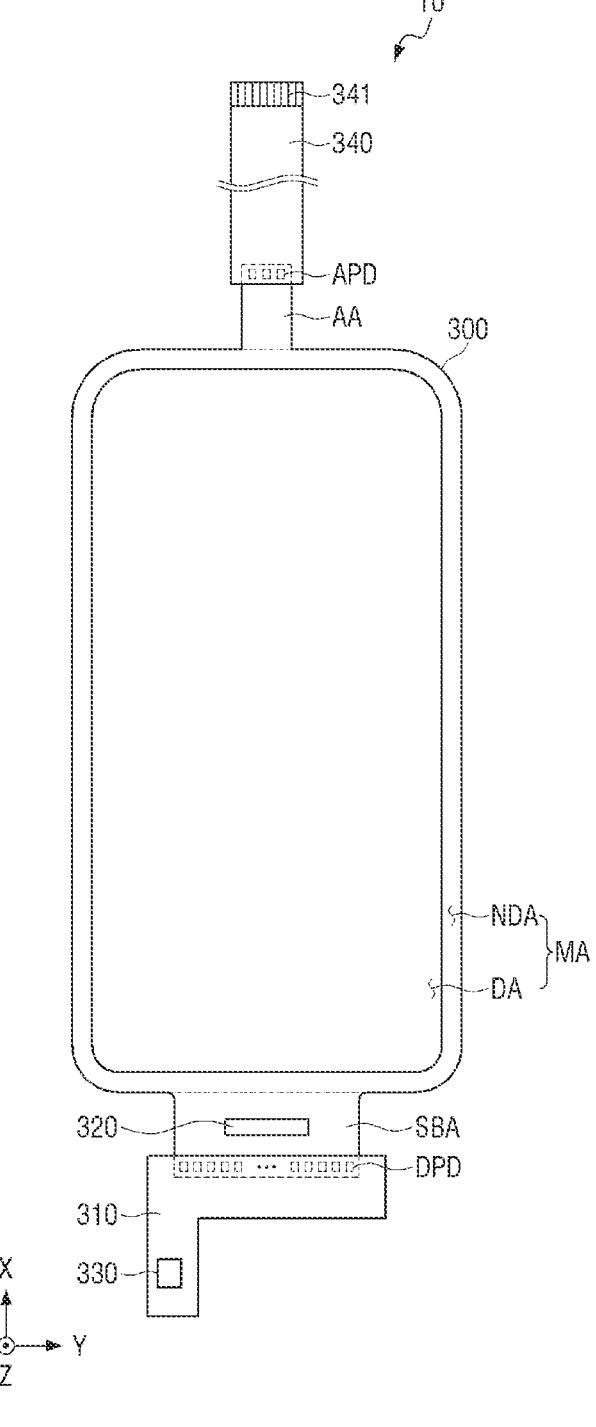
FIG. 1 is a plan view showing a display device with protruding components extended, according to an embodiment of the present disclosure.
Figure 2:
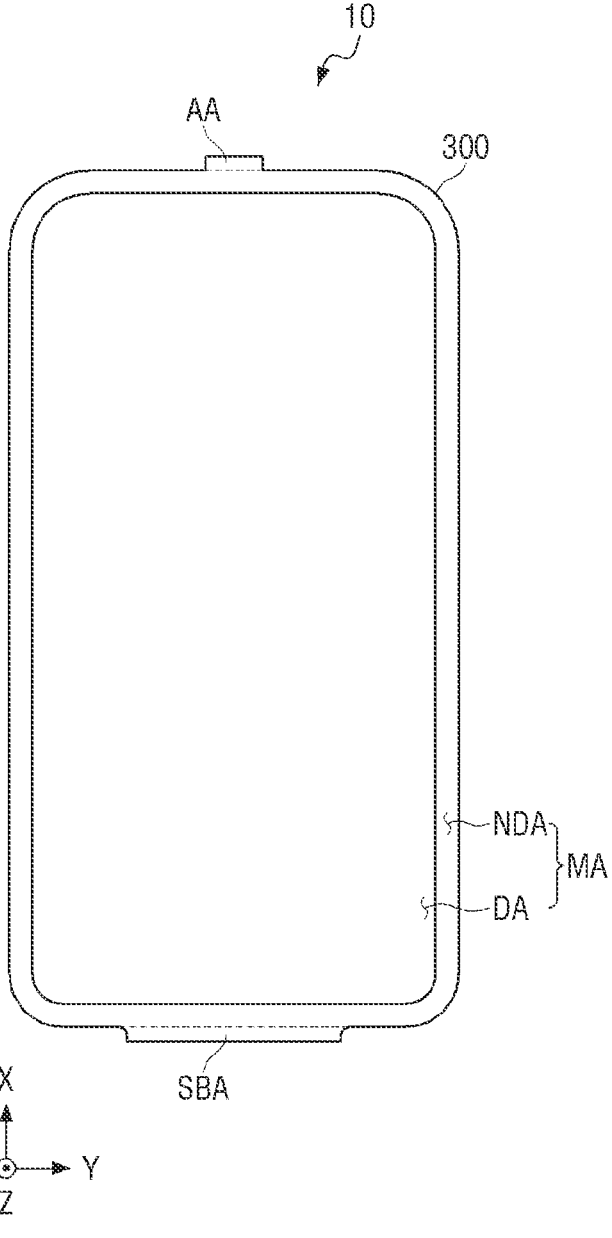
FIG. 2 is a plan view of the display device of FIG. 1 shown with protruding components folded behind a display area, according to an embodiment.

FIGS. 1 and 2 are plan views showing a display device according to an embodiment of the present disclosure.

Referring to FIGS. 1 and 2, a display device 10 according to an embodiment of the present disclosure may be employed by portable electronic devices such as a mobile phone, a smart phone, a tablet PC, a mobile communications terminal, an electronic notebook, an electronic book, a portable multimedia player (PMP), a navigation device and a ultra mobile PC (UMPC). Alternatively, the display device 10 according to an embodiment of the present disclosure may be used as a display unit of a television, a laptop computer, a monitor, an electronic billboard, or the Internet of Things (IOT). Alternatively, the display device 10 according to the embodiment of the present disclosure may be applied to wearable devices such as a smart watch, a watch phone, an glasses-type display, and a head-mounted display (HMD) device. Alternatively, the display device 10 according to the embodiment may be used as a center information display (CID) disposed at the instrument cluster, the center fascia or the dashboard of a vehicle, as a room mirror display on the behalf of the side mirrors of a vehicle, as a display placed on the back of each of the front seats that is an entertainment system for passengers at the rear seats of a vehicle.

As used herein, the first direction (x-axis direction) may refer to the longer side direction of the display device 10, for example, the vertical direction of the display device 10. The second direction (y-axis direction) may be the shorter side direction of the display device 10, for example, the horizontal direction of the display device 10. A third direction (z-axis direction) may refer to the thickness direction of the display device 10. The corners where the shorter sides in the first direction (x-axis direction) meet the longer sides in the second direction (y-axis direction) may be rounded with a predetermined curvature or may be a right angle.

According to the embodiment of the present disclosure, the display device 10 includes a display panel 300, a display circuit board 310, a display driver circuit 320, a touch driver circuit 330, and an antenna circuit board 340. A connector 341 may be formed on one side of the antenna circuit board 340.

The display panel 300 may be a light-emitting display panel including light-emitting elements. For example, the display panel 300 may be an organic light-emitting display panel using organic light-emitting diodes including organic emissive layer, a micro light-emitting diode display panel using micro LEDs, a quantum-dot light-emitting display panel including quantum-dot light-emitting diodes including an quantum-dot emissive layer, or an inorganic light-emitting display panel using inorganic light-emitting elements including an inorganic semiconductor.

The display panel 300 may be a flexible display panel that can be easily bent, folded or rolled. For example, the display panel 300 may be a foldable display panel that can be folded and unfolded, a curved display panel having a curved display surface, a bended display panel having a bent area other than the display surface, a rollable display panel that can be rolled and unrolled, or a stretchable display panel that can be stretched.

The display panel 300 may include a main area MA and a subsidiary area SBA from one side of the main area MA. An antenna layer ANTL (see FIG. 3) including a Yagi-Uda antenna may be disposed on the display panel 300. The antenna layer ANTL (see FIG. 3) may include a first area A1 (see FIG. 7) corresponding to a display area DA of the display panel 300, a second area A2 (see FIG. 7) corresponding to a non-display area NDA of the display panel 300, and protruding area AA protruding from the opposite side of the main area MA. For example, the protruding area AA may be a portion of the antenna layer ANTL (see FIG. 3) attached on the display panel 300 and may protrude in the first direction (x-axis direction), which is a direction away from the display panel 300.

The main area MA may include a display area DA where images are displayed, and a non-display area NDA around the display area DA. The display area DA may occupy most of the main area MA. The display area DA may be disposed at the center of the main area MR. The non-display area NDA may be disposed on the outer side of the display area DA. The non-display area NDA may be defined as an edge of the display panel 300. The non-display area NDA may referred to as a "dead space" area DS.

The subsidiary area SBA may protrude from one side of the main area MA in the first direction (x-axis direction). For example, one side of the main area MA may be the lower side of the main area MA. As shown in FIG. 1, the length of the subsidiary area SBA in the first direction (x-axis direction) may be smaller than the length of the main area MA in the first direction (x-axis direction). The length of the subsidiary area SBA in the second direction (y-axis direction) may be smaller than the length of the main area MA in the second direction (y-axis direction). It is, however, to be understood that the present disclosure is not limited thereto.

Referring to FIG. 2, the subsidiary area SBA may be bent, and at least a part of the subsidiary area SBA may be located under the display panel 300 when it is bent. When it is bent, at least a part of the subsidiary area SBA may overlap with the main area MA of the display panel 300 in the thickness direction (z-axis direction).

Display pads DPD may be disposed at one edge of the subsidiary area SBA. The edge of the subsidiary area SBA may be the lower edge of the subsidiary area SBA. The display circuit board 310 may be attached on the display pads DPD of the subsidiary area SBA. The display circuit board 310 may be attached to the display pads DPD of the subsidiary area SBA using a conductive adhesive such as an anisotropic conductive film and an anisotropic conductive paste. The display circuit board 310 may be a flexible printed circuit board (FPCB) that can be bent, a rigid printed circuit board (PCB) that is rigid and not bendable, or a hybrid printed circuit board including a rigid printed circuit board and a flexible printed circuit board.

The display driver circuit 320 may be disposed on the subsidiary area SBA of the display panel 300. The display driver circuit 320 may receive control signals and supply voltages and may generate and output signals and voltages for driving the display panel 300. The display driver circuit 320 may be implemented as an integrated circuit (IC).

A touch driver circuit 330 may be disposed on the display circuit board 310. The touch driver circuit 330 may be implemented as an integrated circuit. The touch driver circuit 330 may be attached on the display circuit board 310.

The touch driver circuit 330 may be electrically connected to sensor electrodes of a sensor electrode layer of the display panel 300 through the display circuit board 310. The touch driver circuit 330 may output a touch driving signal to each of the sensor electrodes and may detect a voltage change according to mutual capacitance of the sensor electrodes.

The sensor electrode layer of the display panel 300 may sense a physical contact and/or near proximity. A physical contact refers to that an object such as the user's finger and a pen is brought into contact with the cover window disposed on the sensor electrode layer. A near proximity refers to that an object such as a person's finger or a pen is close to but is spaced apart from the cover window 100, such as hovering over it.

On the display circuit board 310, a power supply for supplying driving voltages for driving the display pixels and the display driver circuit 320 of the display panel 300 may be further disposed. Alternatively, the power supply may be integrated with the display driver circuit 320, in which case, the display driver circuit 320 and the power supply may be implemented as a single integrated circuit.

The protruding area AA of the antenna layer ANTL (see FIG. 3) may include at least one of an antenna electrode, a feed line and a ground line of an antenna apparatus ("module") for wireless communications. (The antenna layer ANTL may be considered an example of an antenna module.) The protruding area AA may protrude in the first direction (x-axis direction) from the opposite side of the main area MA. For example, the opposite side of the main area MA may be the upper side of the main area MA. As shown in FIG. 1, the length of the protruding area AA in the first direction may be smaller than the length of the main area MA in the first direction. The length of the protruding area AA in the second direction (y-axis direction) may be smaller than the length of the main area MA in the second direction. It is, however, to be understood that the present disclosure is not limited thereto.

The antenna layer ANTL (see FIG. 3) may include a stack structure in which a plurality of electrodes and a plurality of lines are formed on a substrate by a FPCB fabrication process and thus may be bent. Accordingly, as shown in FIG. 2, at least a part of the antenna area AA may be bent, and the bent part of the antenna area AA may be located under the display panel 300. When it is bent, at least a part of the antenna area ARE may overlap with the main area MA of the display panel 300 in the thickness direction (z-axis direction).

Antenna pads APD may be disposed at one edge of the protruding area AA. The antenna circuit board 340 may be attached on the antenna pads APD of the protruding area AA. The antenna circuit board 340 may be attached on the antenna pads APD of the protruding area AA using a conductive adhesive such as an anisotropic conductive film and an anisotropic conductive adhesive. One side of the antenna circuit board 340 may include the connector 341 connected to a main circuit board 400 on which an antenna driver circuit 350 (see FIG. 4) is mounted. The antenna circuit board 340 may be a flexible circuit board (FPCB) that can be bent.

Figure 3:
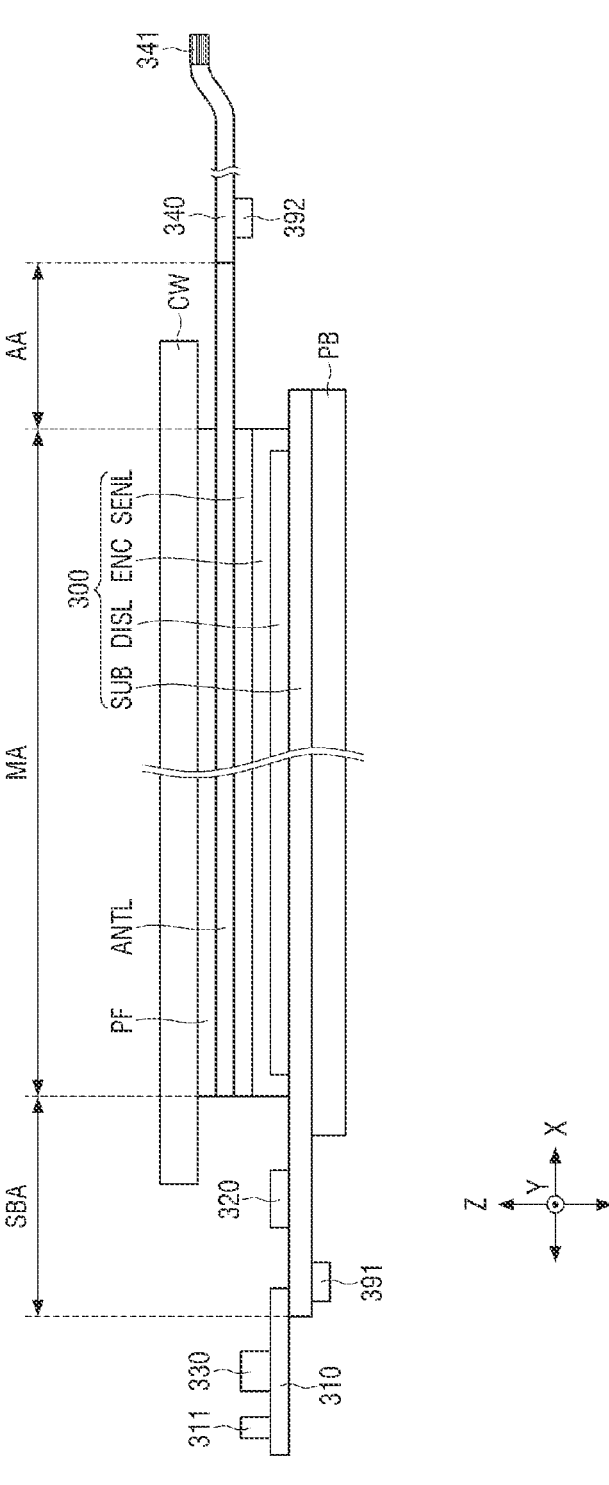
FIGS. 3 and 4 are side views of the display device of FIG. 1, illustrating example internal structures.
Figure 4:
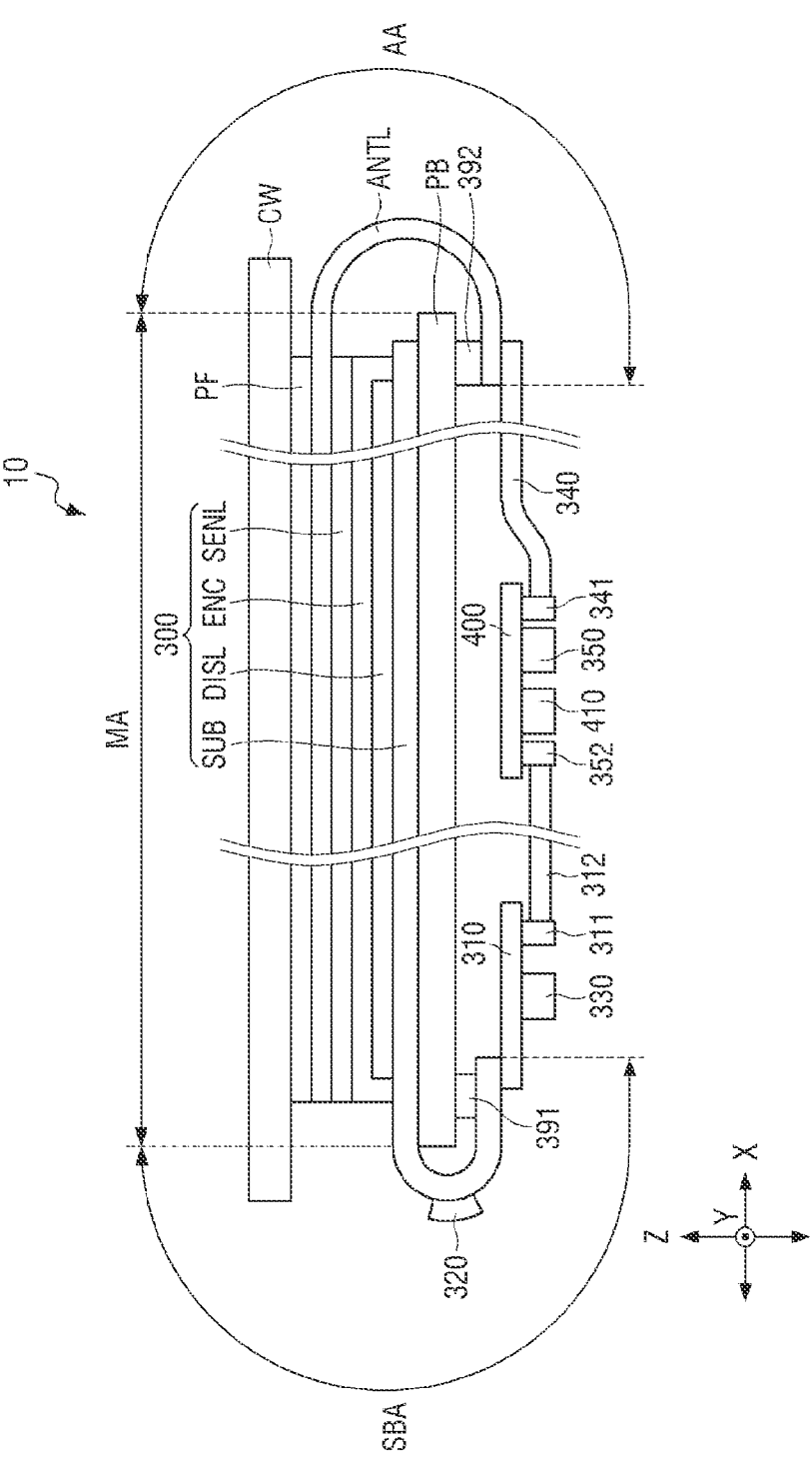

FIGS. 3 and 4 are side views showing a display device according to an embodiment of the present disclosure.

Referring to FIGS. 3 and 4, the display device 10 according to the embodiment may include a display panel 300, a polarizing film PF, a cover window CW, and a panel bottom cover PB. The display panel 300 may include a substrate SUB, a display layer DISL, an encapsulation layer ENC, and a sensor electrode layer SENL.

The substrate SUB may be made of an insulating material such as a polymer resin. The substrate SUB may be a flexible substrate that can be bent, folded, or rolled.

The display layer DISL may be disposed on the main area MA of the substrate SUB. The display layer DISL may include emission areas to display images. The display layer DISL may include a thin-film transistor layer on which thin-film transistors are formed, and an emission material layer on which light-emitting elements emitting light are disposed.

In addition to the emission areas, scan lines, data lines, power lines, etc. for driving light-emitting elements in the emission areas may be disposed in the display area DA of the display layer DISL. In the non-display area NDA of the display layer DISL, a scan driver outputting scan signals to the scan lines, fan-out lines connecting the data lines with the display driver circuit 320, etc. may be disposed.

The encapsulation layer ENC may be disposed on the display layer DISL. The encapsulation layer ENC may encapsulate the emission material layer of the display layer DISL to prevent oxygen or moisture from permeating into the emission material layer of the display layer DISL. The encapsulation layer ENC may be disposed on the upper and side surfaces of the display layer DISL.

The sensor electrode layer SENL may be disposed on the display layer DISL. The sensor electrode layer SENL may include sensor electrodes. The sensor electrode layer SENL can sense a touch using the sensor electrodes.

The antenna layer ANTL may be disposed on the sensor electrode layer SENL. The antenna layer ANTL may include a Yagi-Uda antenna 700 (see FIG. 7) and a conductive path SIW (see FIG. 8) for supplying power to the antenna 700. For example, the antenna of the antenna layer ANTL may include a driven element electrode (interchangeably, "feeder" electrode) 710 (see FIG. 7), a reflector electrode 720 (see FIG. 7), and a plurality of director electrodes 730 (see FIG. 7), which will be described later with reference to FIG. 7. In addition, the conductive path may be implemented as a substrate integrated waveguide.

The polarizing film PF may be disposed on the antenna layer ANTL. The polarizing film PF may include a first base member, a linear polarizer, a retardation film such as a λ/4 (quarter-wave) plate, and a second base member. For example, the first base member, the retardation film, the linear polarizer and the second base member may be sequentially disposed on the antenna layer ANTL.

The cover window CW may be disposed on the polarizing film PF. The cover window CW may be attached onto the polarizing film PF by a transparent adhesive member such as an optically clear adhesive (OCA) film.

A panel bottom cover PB may be disposed under the display panel 300. The panel bottom cover PB may be attached to the lower surface of the display panel 300 by an adhesive member. The adhesive member may be a pressure-sensitive adhesive (PSA). The panel bottom cover PB may include at least one of: a light-blocking member for absorbing light incident from outside, a buffer member for absorbing external impact, and a heat dissipating member for efficiently discharging heat from the display panel 300.

The light-blocking member may be disposed under the display panel 300. The light-blocking member blocks the transmission of light to prevent the elements disposed thereunder from being seen from above the display panel 300, such as the display circuit board 310. The light-blocking member may include a light-absorbing material such as a black pigment and a black dye.

The buffer member may be disposed under the light-blocking member. The buffer member absorbs an external impact to prevent the display panel 300 from being damaged. The buffer member may be made up of a single layer or multiple layers. For example, the buffer member may be formed of a polymer resin such as polyurethane, polycarbonate, polypropylene and polyethylene, or may be formed of a material having elasticity such as a rubber and a sponge obtained by foaming a urethane-based material or an acrylic-based material.

The heat dissipating member may be disposed under the buffer member. The heat-dissipating member may include a first heat dissipation layer including graphite or carbon nanotubes, and a second heat dissipation layer formed of a thin metal film such as copper, nickel, ferrite and silver, which can block electromagnetic waves and have high thermal conductivity.

As shown in FIG. 4, the subsidiary area SBA of the substrate SUB may be bent, and when bent may be located under the display panel 300. The subsidiary area SBA of the substrate SUB may be attached to the lower surface of the panel bottom cover PB by a first adhesive layer 391. The first adhesive member 391 may be a pressure-sensitive adhesive.

As shown in FIG. 4, the protruding area AA of the antenna layer ANTL may be bent, and at least a part of the protruding area AA may be located under the display panel 300 when it is bent. The protruding area AA may be attached to the lower surface of the panel bottom cover PB by a second adhesive member 392. The second adhesive member 392 may be a pressure-sensitive adhesive.

The display circuit board 310 may be attached to the display pads DPD of the subsidiary area SBA of the substrate SUB by using a conductive adhesive such as an anisotropic conductive film and an anisotropic conductive adhesive. The display circuit board 310 may include a connector 311 connected to a flexible circuit board 312. The display circuit board 310 may be connected to a connector 352 of the main circuit board 400 through the flexible circuit board 312.

The touch driver circuit 330 may be disposed on the display circuit board 310. The touch driver circuit 330 may generate touch data based on changes in electrical signals detected by each of the sensor electrodes of the sensor electrode layer of the display panel 300 and may transmit the touch data to the main processor 410 of the main circuit board 400. The main processor 410 may calculate coordinates of a location where a touch is made by analyzing the touch data.

The antenna circuit board 340 may be attached to the antenna pads APD of the protruding area AA using a conductive adhesive such as an anisotropic conductive film and an anisotropic conductive adhesive. A connector 351 of the antenna circuit board 340 may be connected to a connector 351 of the main circuit board 400. The protruding area AA may be connected to the main circuit board 400 by the antenna circuit board 340.

The main circuit board 400 may be a rigid printed circuit board (PCB) that is hard and does not easily bend. The main processor 410 and the antenna driver circuit 350 may be disposed on the main circuit board 400.

The antenna driver circuit 350 may be electrically connected to the antenna of the antenna layer ANTL through the antenna circuit board 340. The antenna driver circuit 350 may receive an electromagnetic wave signal by the antenna and may output an electromagnetic wave signal to be transmitted to the antenna. The antenna circuit board 340 may be implemented as an integrated circuit (IC).

The antenna driver circuit 350 may process an electromagnetic wave signal transmitted and received through the antenna. For example, the antenna driver circuit 350 may change the amplitude of the electromagnetic wave signal received by the antenna. Alternatively, the antenna driver circuit 350 may not only change the amplitude of the electromagnetic wave signal received by the antenna electrode but also the phase. The antenna driver circuit 350 may transmit the processed electromagnetic wave signal to a mobile communication module. The mobile communication module may be disposed on the main circuit board 400.

The antenna driver circuit 350 may change the amplitude of the electromagnetic wave signal transmitted from the mobile communication module. Alternatively, the antenna driver circuit 350 may change not only the amplitude of the electromagnetic wave transmitted from the mobile communication module, but also the phase. The antenna driver circuit 350 may transmit the processed electromagnetic wave signal to the antenna.

Figure 5:
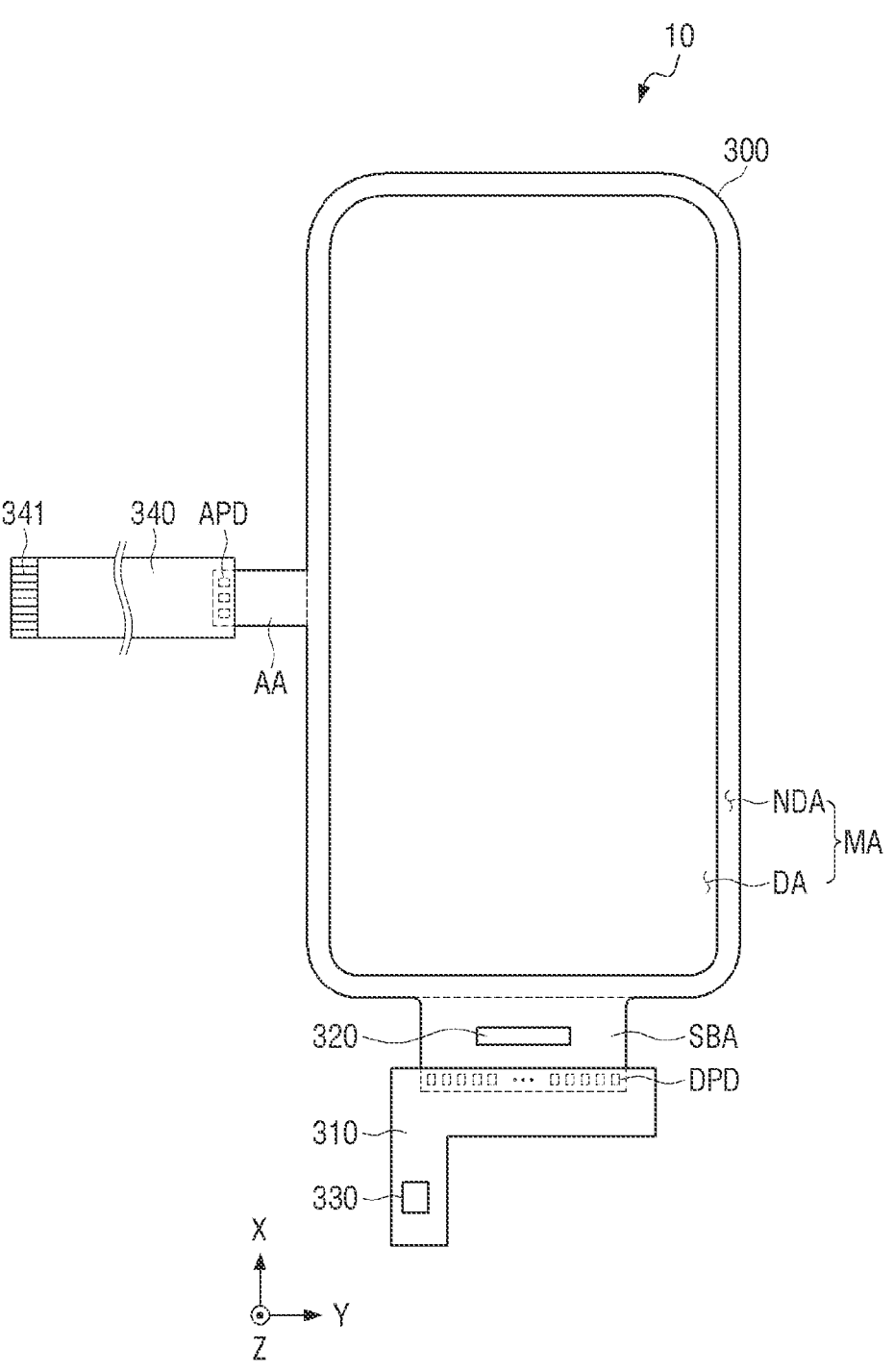
FIGS. 5 and 6 are plan views showing a display device according to other respective embodiments of the present disclosure.
Figure 6:
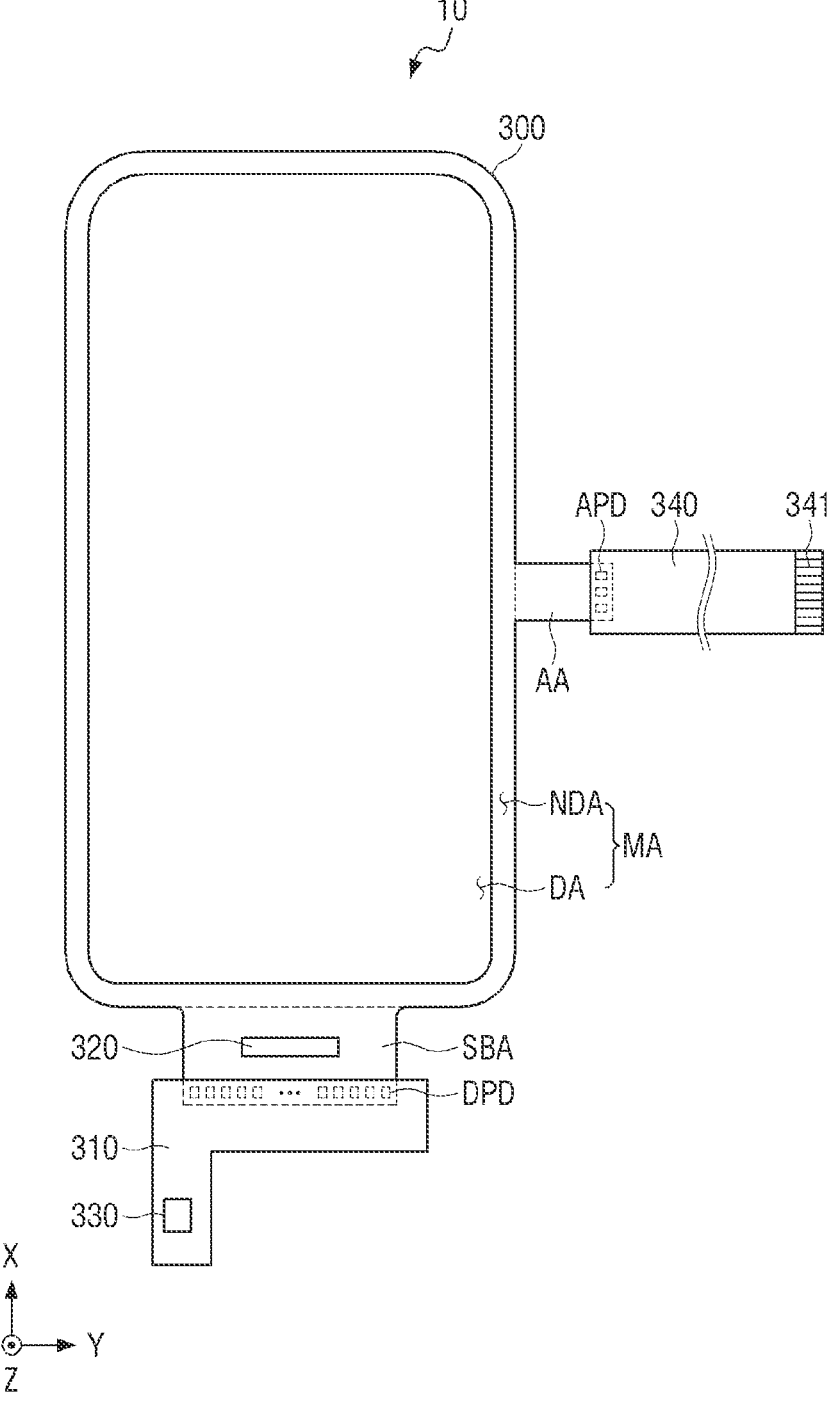

FIG. 5 is a plan view showing a display device according to another embodiment of the present disclosure. FIG. 6 is a plan view showing a display device according to yet another embodiment.

The embodiment of FIG. 5 is different from the embodiment of FIGS. 1 and 2 in that the protruding area AA protrudes from the left side of the main area MA in the second direction (y-axis direction). The embodiment of FIG. 6 is different from the embodiment of FIGS. 1 and 2 in that the protruding area AA protrudes from the right side of the main area MA in the second direction (y-axis direction). The elements of FIGS. 5 and 6 identical to those of FIGS. 1 and 2 will not be described to avoid redundancy.

As shown in FIGS. 5 and 6, the protruding area AA may protrude from one side of the main area MA. The one side of the main area MA may be one of the upper side, the lower side, the left side and the right side of the main area MA.

Although not shown in the drawings, the protruding area AA may protrude from the lower side of the main area MA in the second direction (y-axis direction), and the protruding area AA may be spaced apart from the subsidiary area SBA in the second direction (y-axis direction). In this instance, the length of the protruding area AA in the first direction (x-axis direction) may be smaller than the length of the subsidiary area SBA in the first direction (x-axis direction). The length of the protruding area AA in the second direction (y-axis direction) may be smaller than the length of the subsidiary area SBA in the second direction (y-axis direction). It is, however, to be understood that the present disclosure is not limited thereto.

In the following description, the structure of the protruding area AA and the antenna according to the embodiment of FIGS. 1 and 2 will be described. It should be understood, however, that the characteristics of the antenna described below may also be applied to the embodiments of FIGS. 5 and 6.

Figure 7:
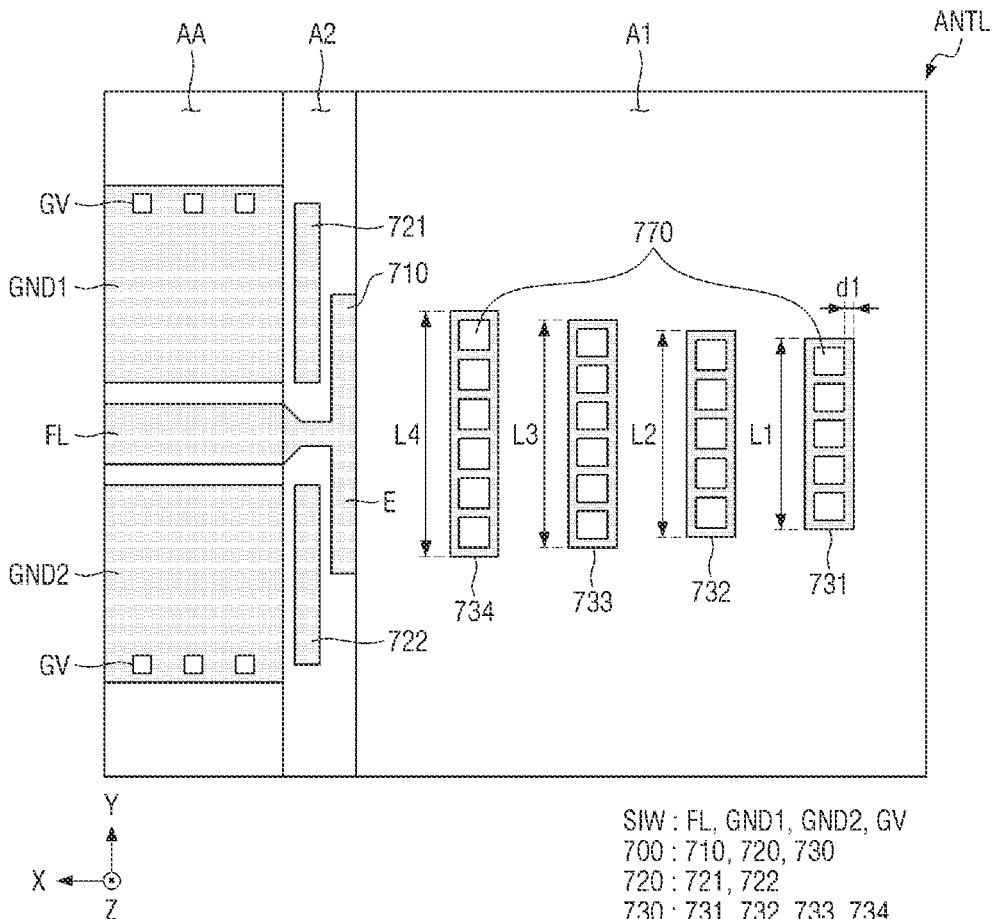
FIG. 7 is a plan view showing an example of the antenna layer of the display device of FIG. 3.
Figure 8:
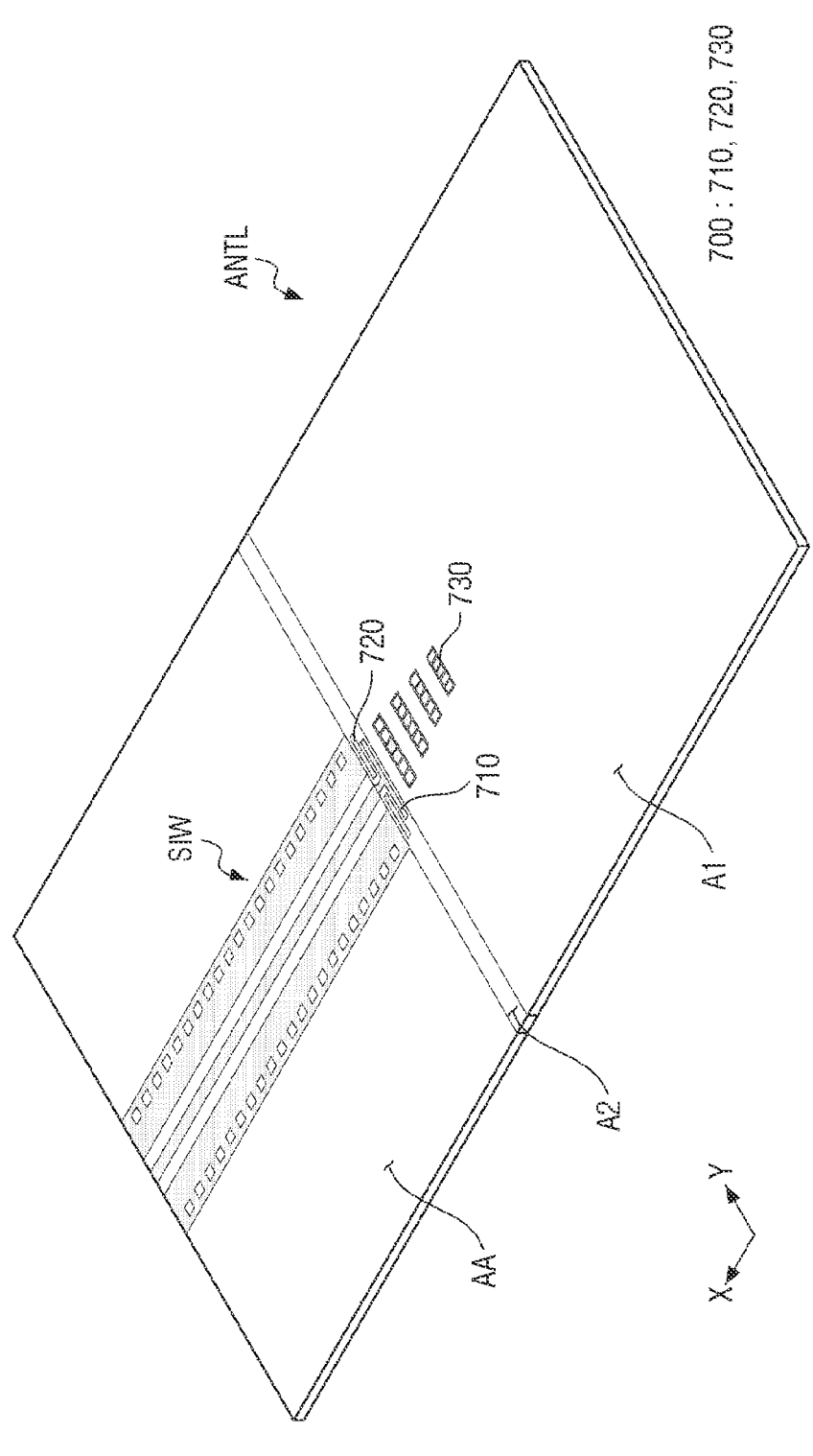
FIG. 8 is a perspective view showing an example of the antenna layer of the display device of FIG. 3.

FIG. 7 is a plan view showing an example of the antenna layer ANTL of FIG. 3. FIG. 8 is a perspective view showing an example of the antenna layer ANTL of FIG. 3.

Referring to FIGS. 7 and 8, the antenna layer ANTL may include a first area A1 corresponding to the display area DA of the display panel 300, a second area A2 corresponding to the non-display area NDA of the display panel 300, and an protruding area AA protruding from the opposite side of the main area MA. For example, the first area A1 may be disposed to overlap with the display area DA of the display panel 300. The second area A2 may be disposed to overlap with the non-display area NDA of the display panel 300. The protruding area AA may protrude from at least a part of the second area A2 in the direction away from the display panel 300 (e.g., in the first direction (x-axis direction)).

The antenna layer ANTL may include a Yagi-Uda antenna 700 and a conductive path SIW for supplying power to the antenna 700. The Yagi-Uda antenna may be a subminiature antenna of approximately 60 GHz band that is compact and easy to be incorporated into the display device 10. Such an antenna 700 can obtain a high radiation gain even with a single component, and thus can increase transmission and reception efficiency of wireless communications. In addition, the antenna 700 according to the embodiment of the present disclosure does not require a feed transmission line network for array expansion (e.g., beam steering), and thus can reduce transmission loss. Hereinafter, the antenna 700 according to the embodiment of the present disclosure disposed in the antenna layer ANTL will be described in detail.

The antenna layer ANTL may include an antenna 700 including a driven element (feeder) electrode 710, a reflector electrode 720, and a plurality of director electrodes 730. Each of the director electrodes 730 may electrically isolated from the other director electrodes 730 and from the feeder electrode 710. In other words, each director electrode 730 may be a passive radiator that is electromagnetically excited from signal energy radiating from the feeder electrode 710 (as is the radiating mechanism of a Yagi-Uda antenna). The conductive path SIW that supplies power to the antenna 700 may be designed by a substrate integrated waveguide technique. To this end, the antenna 700 according to the embodiment of the present disclosure is configured to be connected to a substrate integrated waveguide to receive power, and the antenna electrode 710, 720 and 730 is formed on a transparent dielectric substrate 1600 (see FIG. 16) using a fabrication process of a flexible printed circuit board (FPCB).

The conductive path SIW may have a structure surrounded by a metal wall. For example, the conductive path SIW may include a plurality of ground vias GV arranged to surround the periphery of the conductive path SIW. A feed line FL for supplying power to the driven element electrode 710 may be disposed between a first ground line GND1 and a second ground line GND2 of the conductive path SIW. Each of the feed line FL, the first ground line GND1 and the second ground line GND2 may be electrically connected to the antenna pads APD (See FIG. 1) disposed at one edge of the protruding area AA.

The driven element electrode 710 and the reflector electrode 720 of the antenna 700 are disposed in the second area A2 of the antenna layer ANTL corresponding to the non-display area NDA of the display panel 300. In addition, the plurality of director electrodes 730 of the antenna 700 is disposed in the first area A1 of the antenna layer ANTL corresponding to the display area DA of the display panel 300.

The driven element electrode 710 may be electrically connected to the feed line FL of the conductive path SIW and may be in the form of a dipole antenna. For example, the driven element electrode 710 may be a half-wave dipole antenna (dimension in the y-axis direction is one half of a wavelength) having the shape of the letter T.

The reflector electrode 720 is disposed between the driven electrode 710 and the protruding area AA in the second area A2. The reflector electrode 720 is configured to reflect electromagnetic wave signals radiated from the driven element electrode 710. For example, the reflector electrode 720 may reflect electromagnetic wave signals radiated from the driven element electrode 710 in the direction away from the display panel 300 toward the inner direction of the display panel 300. The reflector electrode 720 may be a floating electrode not directly connected to the driven element electrode 710. The reflector electrode 720 may include a first reflector electrode 721 disposed adjacent to one side of the driven element electrode 710 and a second reflector electrode 722 disposed adjacent to the opposite side of the driven element electrode 710. The first reflector electrode 721 may be disposed between one side of the driven element electrode 710 and the first ground line GND1 of the conductive path SIW. The second reflector electrode 722 may be disposed between the opposite side of the driven element electrode 710 and the second ground line GND2 of the conductive path SIW.

The plurality of director electrodes 730 are arranged in the display area DA of the display panel 300 to set the directivity of the electromagnetic wave signals radiated from the driven element electrode 710. The director electrodes 730 may be arranged spaced apart from the driven element electrode 710 and from each other by predetermined distances. For example, the director electrodes 730 may include a first director electrode 731, a second director electrode 732, a third director electrode 733, and a fourth director electrode 734 (each may hereafter be loosely called a director electrode 730 or one of the director electrodes 730) from the position farthest from the driven element electrode 710 to the position closest to the driven element electrode 710. In other words, the first director electrode 731 is located farthest from the driven element electrode 710 among the director electrodes 730. The fourth director electrode 734 is located closest to the driven element electrode 710 among the director electrodes 730. The second director electrode 732 and the third director electrode 733 may be located between the first director electrode 731 and the fourth director electrode 734.

Although the number of director electrodes is four in the example shown in FIG. 7, the present disclosure is not limited thereto. For example, as the number of director electrodes increases, the directivity of the antenna becomes clearer and radiation gain may increase. Therefore, the number of director electrodes may be variously changed depending on the design. In the following description, the number of director electrodes is four, but it is to be understood that the number of director electrodes is not limited to four.

Each of the director electrodes 730 may include a transparent electrode having a mesh structure. For example, each of the director electrodes 730 includes a plurality of slots (interchangeably, "openings") 770. Each of the plurality of slots 770 may overlap with a pixel (not shown) formed in the display area DA of the display panel 300 in the thickness direction (z direction) of the display device 10. When the transparent electrode forming each of the plurality of director electrodes 730 is very small (e.g., for millimeter wave frequency applications), it may not overlap with a pixel (not shown) in the z direction. The transparent electrode having a mesh structure that is included in each of the plurality of director electrodes 730 may have a first width d1 surrounding each slot 770 on all sides, where the first width d1 may vary depending on the design structure of the pixels formed in the display area DA.

It should be noted that the mesh structure of each of the director electrodes 730 is not limited to the example shown. For example, in forming the mesh structure, the shape and thickness of each of the director electrodes 730 may be variously modified. In addition, the diameter or size and shape of a plurality of slots 770 included in each of the director electrodes 730 may be variously modified.

Figure 12:
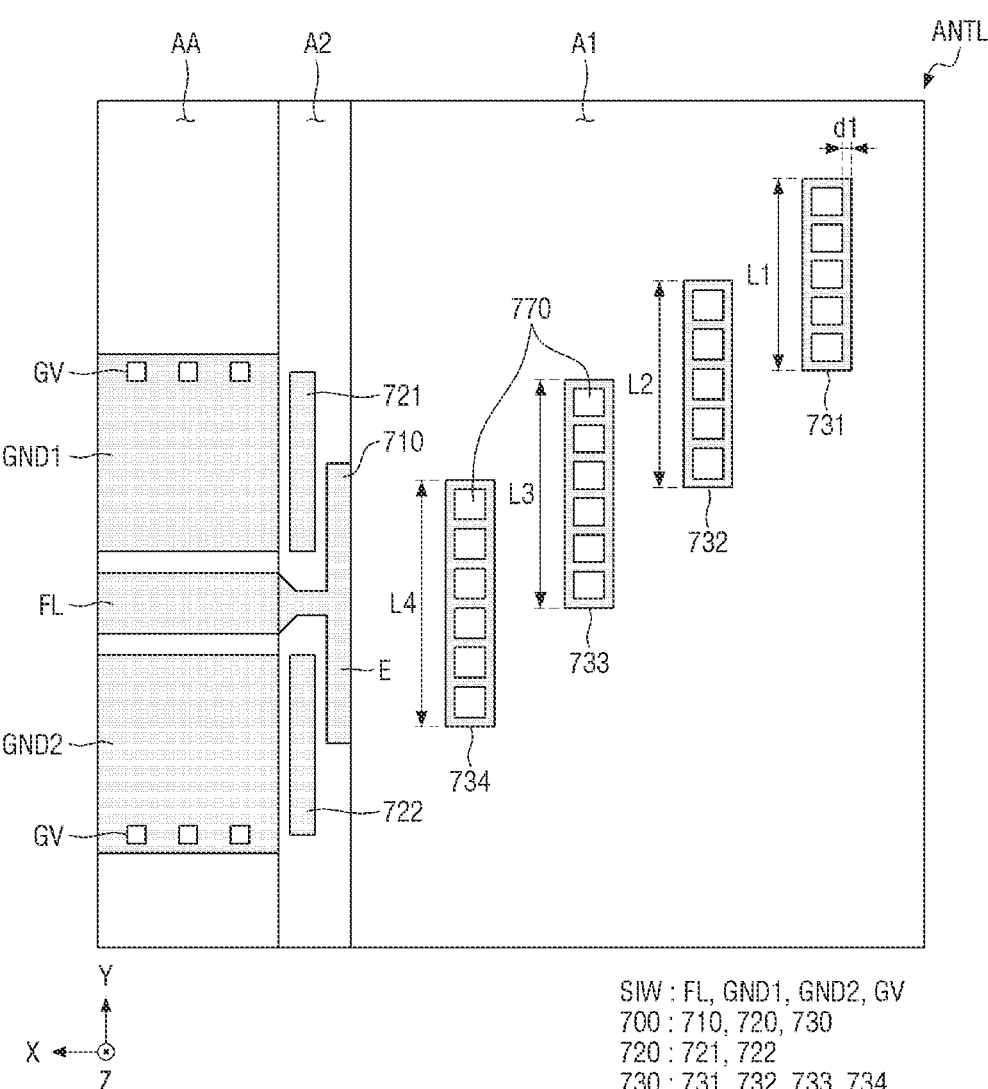
FIG. 12 is a plan view showing another example of the antenna layer of FIG. 3.
Figure 14:
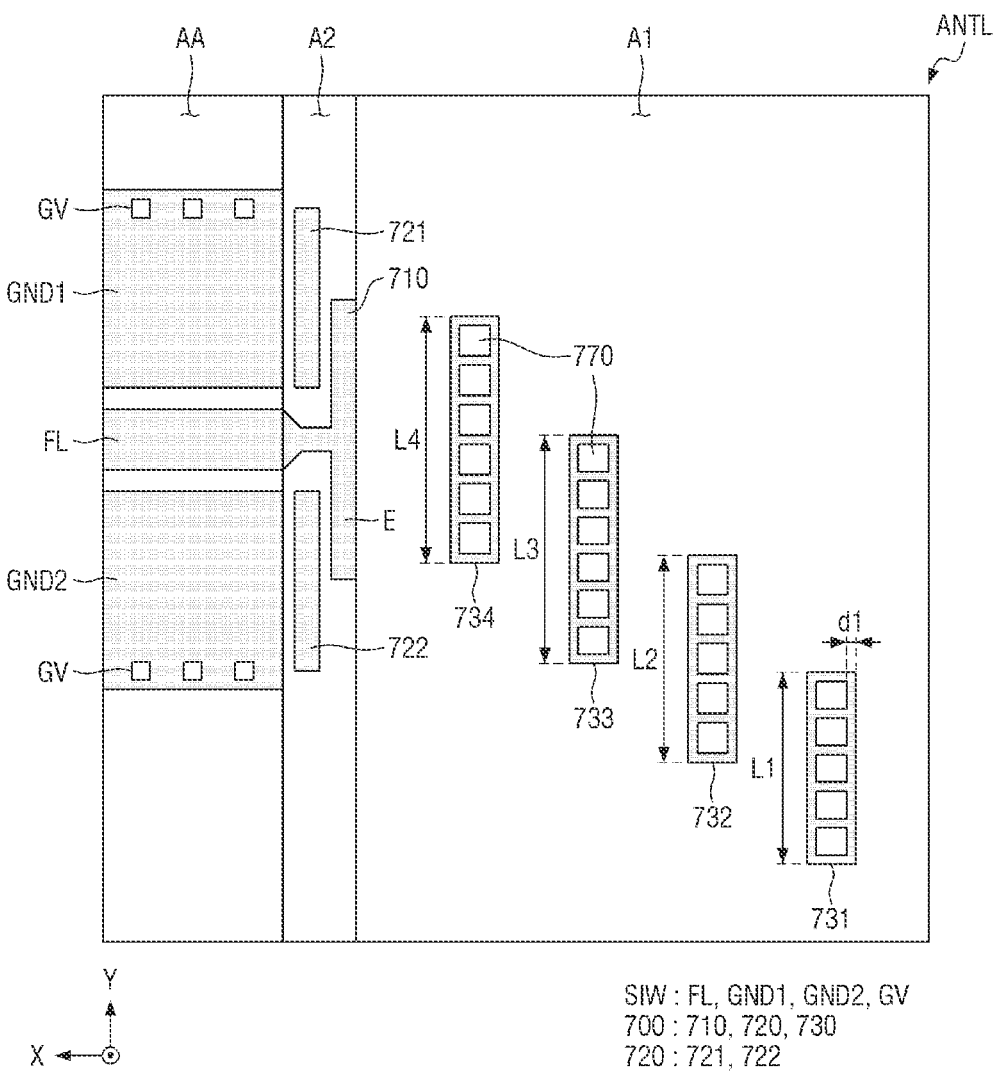
FIG. 14 is a plan view showing yet another example of the antenna layer of FIG. 3.

The director electrodes 730 may be arranged in a straight line with respect to the feeder electrode 710. For example, the director electrodes 730 may be arranged in the first direction (x-axis direction), perpendicular to the front edge "E" of the driven element electrode 710 (right-most edge in FIG. 7) in which the feed line FL is extended such that they are spaced apart from one another, and may be arranged in a straight line to be aligned with the feeder electrode 710 (center points of each of the director electrodes 731-734 are aligned with a center point of the feeder electrode 710 in the x-axis direction). It should be noted that the arrangement of the director electrodes 730 is not limited to a straight line in the x-axis direction. For example, the director electrodes 730 may not be arranged in a straight line perpendicular to the front edge E as shown in FIGS. 12 and 14 in view of a desired directivity/boresight (beam pointing) direction of electromagnetic wave signals radiated from the antenna 700. For instance, according to embodiments of the present disclosure, boresight direction changes are possible in a range of approximately ±15 degrees by changing the arrangement of the director electrodes 730.

The director electrodes 730 may have different lengths. For example, the lengths of the director electrodes 730 in the second direction (y-axis direction) perpendicular to the first direction (x-axis direction) may become shorter stepwise from the position farthest from the driven element electrode 710 to the position closest to the driven element electrode 710. For example, the first director electrode 731 may have a first length L1 in the second direction, the second director electrode 732 may have a second length L2 in the second direction, the third director electrode 733 may have a third length L3 in the second direction, and the fourth director electrode 734 may have a fourth length L4 in the second direction. The fourth length L4 may be longer than the third length L3, the third length L3 may be longer than the second length L2, and the second length L1 may be longer than the first length L1. According to another embodiment, each of the director electrodes 730 may have the same length. According to another embodiment, some electrodes (less than all) selected from among the director electrodes 730 may have the same length. When the length of the feeder electrode 710 in the y-axis direction is λ/2 (half a wavelength), each of the lengths L1 to L4 may be slightly smaller than λ/2. The director electrodes 731 to 734 are spaced apart from one another by distances sufficient to achieve desired EM coupling from one director electrode to the next. Distances between adjacent director electrodes such as between director electrodes 733 and 734, may be uniform or non-uniform, and may be smaller than any of the lengths L1 to L4. The distance between the feeder electrode 710 and the closest director electrode, 734, may be less than L4.

Figure 9:
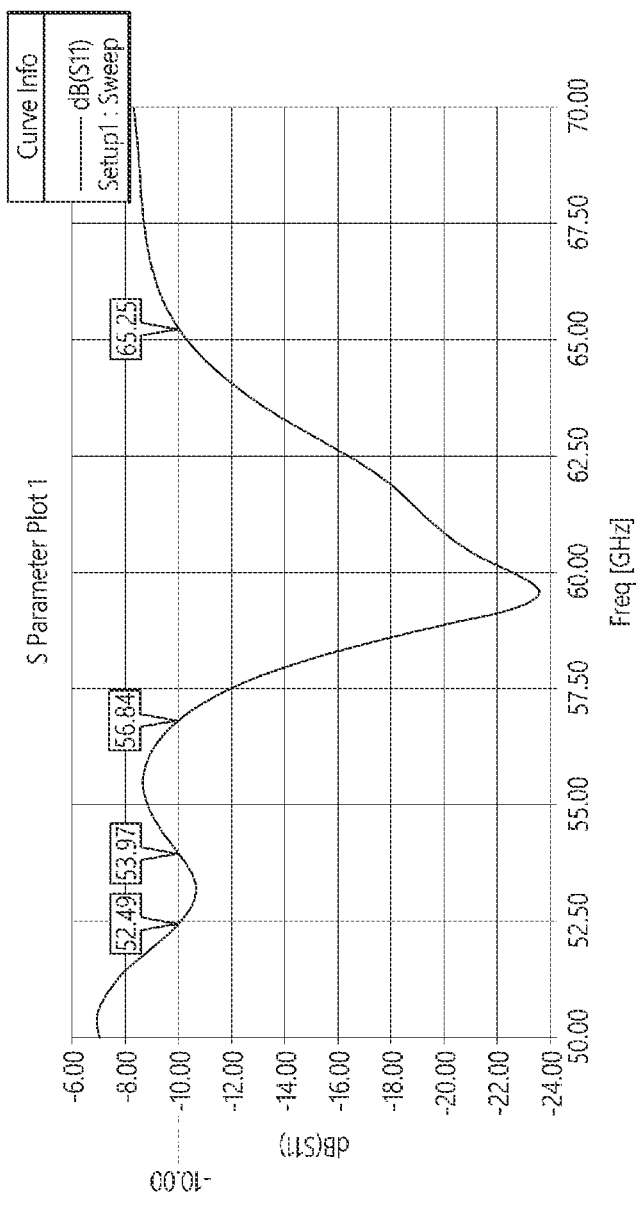
FIG. 9 is a graph of reflection coefficient vs. frequency for an antenna according to an embodiment.
Figure 10:
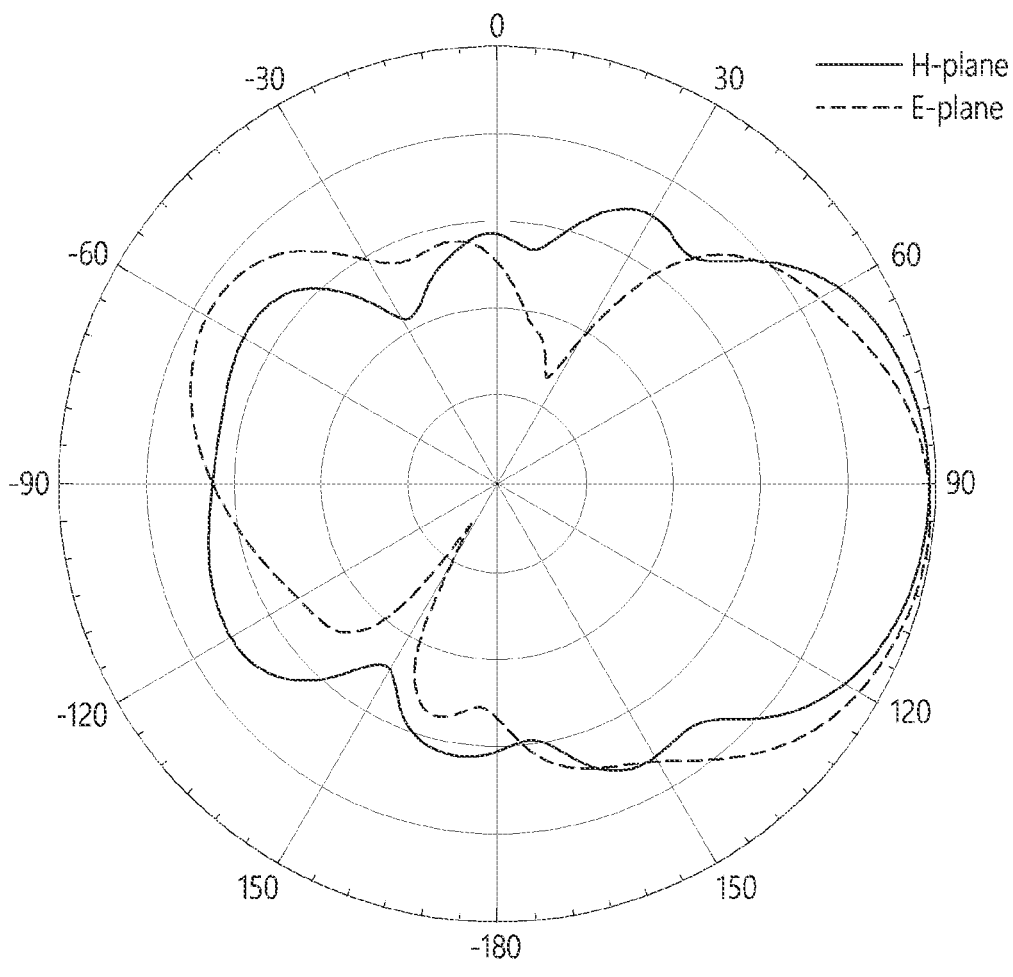
FIG. 10 is a view showing radiation patterns of an antenna according to an embodiment.
Figure 11:
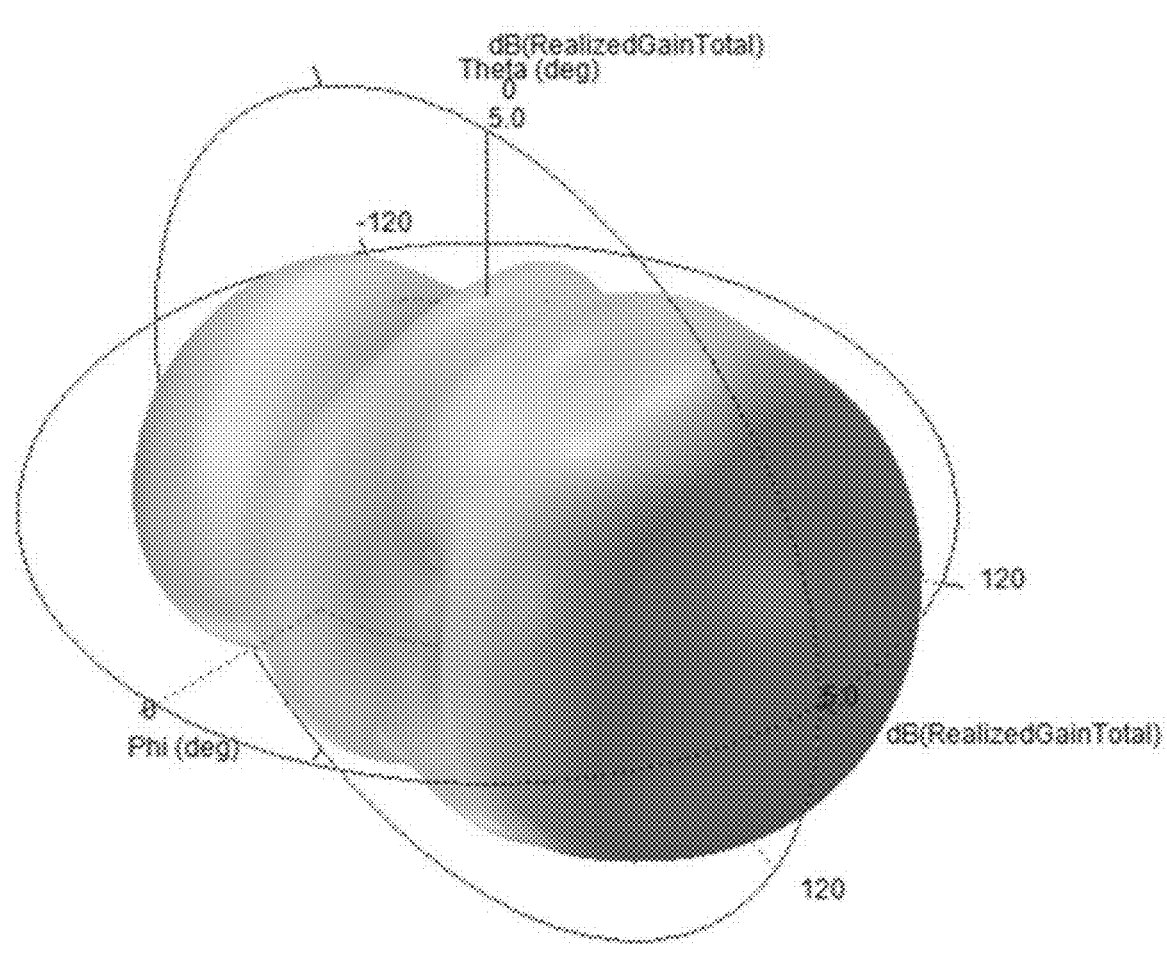
FIG. 11 is a view showing 3D radiation patterns of an antenna according to an embodiment.

FIG. 9 is a view showing a graph of a reflection coefficient ("S11" parameter) vs. frequency of an antenna according to an embodiment. FIG. 10 is a view showing radiation patterns of an antenna according to an embodiment. FIG. 11 is a view showing 3D radiation patterns of an antenna according to an embodiment.

Referring to FIG. 9, an antenna 700 according to an embodiment may have an operating frequency of approximately 56 GHz to 65 GHz. The antenna 700 according to the embodiment may have a wide 10 dB bandwidth (a frequency range for which the reflection coefficient S11 is −10 dB or better) of approximately 8.4 GHz. As described above the antenna 700 according to the embodiment may operate as a broadband antenna within a range of approximately 10 GHz and may operate at a high frequency of approximately 56 GHz or more. Accordingly, it may be suitable as a frequency-modulated continuous wave (FMCW) radar antenna for tracking the position of an object.

Referring to FIG. 10, the antenna 700 according to the embodiment may have the operating frequency of approximately 60 GHz and the peak gain of up to approximately 4.9 dBi in a direction of approximately 95 degrees (which may be a five degree skew with respect to the x-direction of FIG. 7). It should be noted that the direction of approximately 95 degrees is merely illustrative, and the present disclosure is not limited thereto.

Referring to FIG. 11, the antenna 700 according to the embodiment may include a reflector electrode 720 and a plurality of director electrodes 730, where the director electrodes 730 are arranged in a predetermined direction, so that a radiation pattern having directivity may be formed. In FIG. 11, the darker (or red) region may have higher radiation intensity than other regions.

Figure 13:
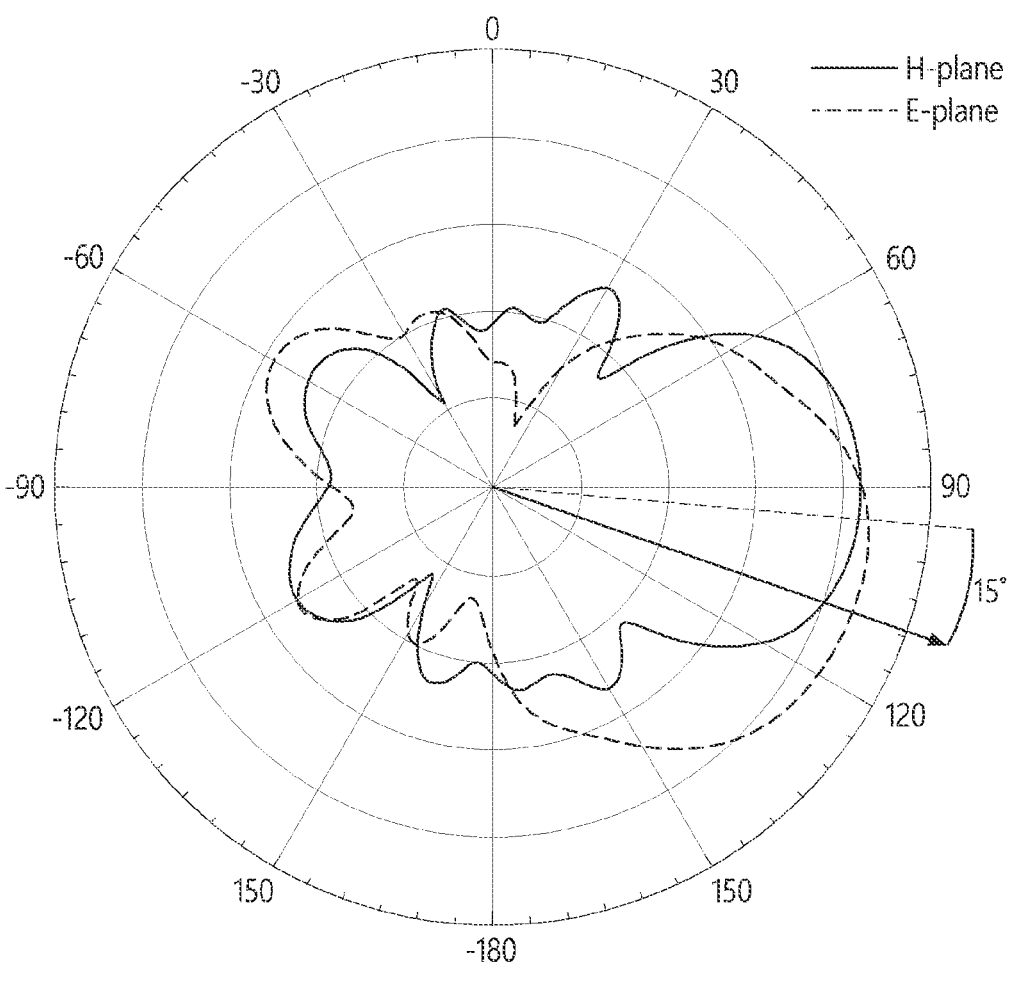
FIG. 13 is a view showing example radiation patterns of the antenna shown in FIG. 12.

FIG. 12 is a plan view showing another example of the antenna layer of FIG. 3. FIG. 13 is a view showing radiation patterns of the antenna shown in FIG. 12.

The embodiment of FIG. 12 is similar to the embodiment of FIG. 7; and therefore redundant descriptions will be omitted.

The embodiment of FIG. 12 differs from the embodiment of FIG. 7 in that a plurality of director electrodes 730 is not arranged in a straight line perpendicular to the front edge E of the feeder electrode 710. For example, in the embodiment of FIG. 7, the center of each of the director electrodes 730 is located on a straight line extended from a feed line FL. On the other hand, in the embodiment of FIG. 12, the center of each of the director electrodes 730 may be located on a straight line inclined at a predetermined angle from a driven element electrode 710.

The director electrodes 730 are arranged such that they are spaced apart from one another in the first direction (x-axis direction) in which the feed line FL is extended. In addition, the center of each of the director electrodes 730 may be located on a straight line inclined in a direction of a predetermined angle, for example, approximately +15 degrees, from the driven element electrode 710. Accordingly, the director electrodes 730 may be arranged in the direction of approximately +15 degrees from the driven element electrode 710.

According to the embodiment of FIG. 12, the centers of two adjacent director electrodes may have a predetermined offset distance in the second direction (y-axis direction). For example, the center of the first director electrode 731 and the center of the second director electrode 732 may have a predetermined offset distance in the second direction (y-axis direction), the center of the second director electrode 732 and the center of the third director electrode 733 may have a predetermined offset distance in the second direction (y-axis direction), and the center of the third director electrode 733 and the center of the fourth director electrode 734 may have a predetermined offset distance in the second direction (y-axis direction). All of the offset values may be all equal, or may have different levels in view of steering characteristics of the antenna.

It can be seen from FIG. 13 that, as the director electrodes 730 are arranged in the direction of approximately +15 degrees from the first direction (x-axis direction), the radiation pattern of the antenna 700 has a beam boresight of approximately +15 degrees relative to the boresight direction of the antenna of FIG. 7.

Figure 15:
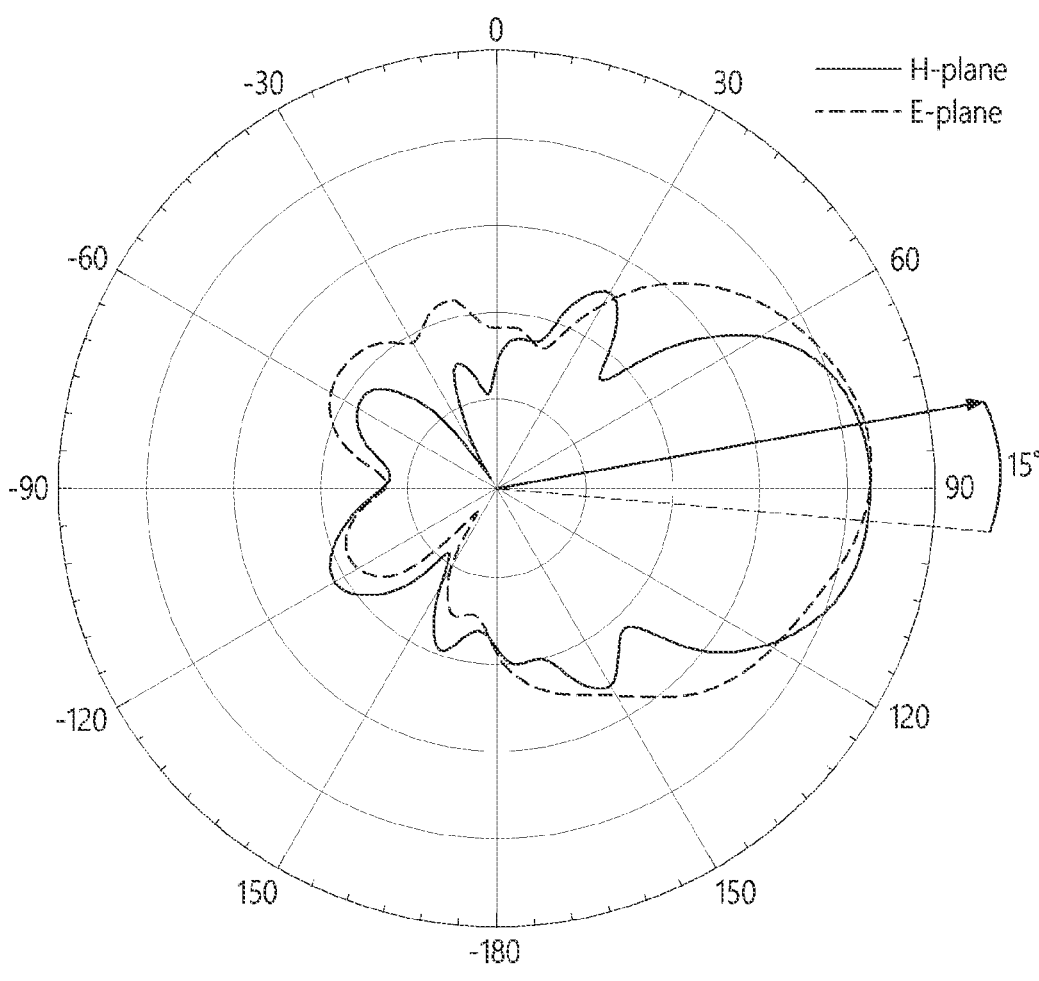
FIG. 15 is a view showing radiation patterns of the antenna shown in FIG. 14.

FIG. 14 is a plan view showing yet another example of the antenna layer of FIG. 3. FIG. 15 is a view showing radiation patterns of the antenna shown in FIG. 14.

The embodiment of FIG. 14 is substantially identical to the embodiment of FIG. 12; and, therefore, the redundant descriptions will be omitted.

The embodiment of FIG. 12 is different from the embodiment of FIG. 14 in that a plurality of director elements is arranged in a direction of approximately −15 degrees from the driven element electrode 710. For example, the director electrodes 730 may be arranged in the direction of approximately −15 degrees from the first direction (x-axis direction).

It can be seen from FIG. 15 that, as the director electrodes 730 are arranged in the direction of approximately −15 degrees from the first direction (x-axis direction), the radiation pattern of the antenna 700 has a boresight direction of approximately −15 degrees relative to that of the antenna 700 of FIG. 7.

As described above with reference to FIGS. 12 to 15, the arrangement direction of the plurality of director electrodes 730 may be adjusted within the range of approximately +15 degrees to −15 degrees with respect to the straight line extended from a feed line. Accordingly, the radiation patterns of the antenna 700 may be adjusted within the range of approximately +15 degrees to −15 degrees according to the arrangement direction of the director electrodes 730.

Figure 16:
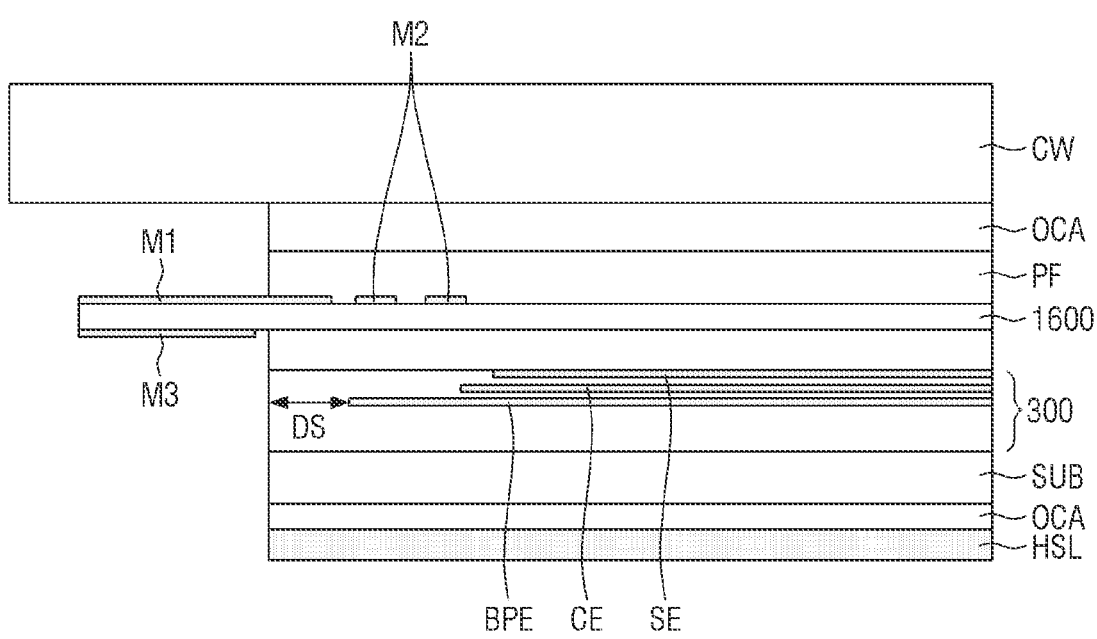
FIG. 16 is a cross-sectional view for illustrating a method of forming an antenna on a transparent dielectric substrate using an FPCB fabrication process according to an embodiment.

FIG. 16 is a cross-sectional view for illustrating a method of forming an antenna on a transparent dielectric substrate using an FPCB fabrication process according to an embodiment.

Referring to FIG. 16, a display device (e.g., 10 of FIG. 1) may include a substrate SUB, a display panel 300 disposed on the substrate SUB, a transparent dielectric substrate 1600 disposed on the display panel 300 and including the antenna 700 (see FIG. 7), a polarizing film PF disposed on the transparent dielectric substrate 1600, and a cover window CW attached by a transparent adhesive member such as an optically clear adhesive (OCA) film on the polarizing film PF.

The substrate SUB may be formed of a plastic material such as polycarbonate (PC) and polyethylene terephthalate (PET) or glass.

The display panel 300 may include a display layer DISL (see FIG. 3), an encapsulation layer ENC (see FIG. 3), and a sensor electrode layer SENL (see FIG. 3). The display panel 300 may include a plurality of TFT electrode layers BPE forming thin-film transistors, a cathode electrode layer CE forming a common electrode, and a touch sensor SE including a sensor electrode.

A heat sink layer HSL may be disposed on the lower surface of the substrate SUB by a transparent adhesive member such as an optically clear adhesive (OCA) film. The heat sink layer HSL may be formed of a metal thin film such as copper, nickel, ferrite and silver that can block electromagnetic waves and has excellent thermal conductivity.

According to an embodiment, the display device 10 may include an antenna module for wireless communications by disposing an antenna layer ANTL on the display panel 300. The antenna layer ANTL may be an example of an antenna module and may include a transparent dielectric substrate 1600, a first metal layer M1 and a second metal layer M2 disposed on the upper surface of the transparent dielectric substrate 1600, and a third metal layer M3 disposed on the lower surface of the transparent dielectric substrate 1600.

The transparent dielectric substrate 1600 may be a transparent film including a plastic material such as polycarbonate (PC) and polyethylene terephthalate (PET).

The first metal layer M1 may be extended from the second area A2 (see FIG. 7) of the antenna layer ANTL corresponding to the dead space area DS which is the non-display area NDA of the display panel 300 to the protruding area AA (see FIG. 7). The first metal layer M1 may include a driven element electrode 710 (see FIG. 7) and a reflector electrode 720 (see FIG. 7) of the antenna 700 (see FIG. 7) disposed in the second area A2 (see FIG. 7) of the antenna layer ANTL. In addition, the first metal layer M1 may include, as a conductive path SIW (see FIG. 7), a feed line FL (see FIG. 7), and a first ground line GND1 (see FIG. 7) and a second ground line GND2 (see FIG. 7) disposed on both sides thereof.

The second metal layer M2 may be disposed on at least a part of the first area A1 (see FIG. 7) of the antenna layer ANTL corresponding to the display area DA of the display panel 300. The second metal layer M2 may be formed on the same layer as the first metal layer M1. The second metal layer M2 may include a plurality of director electrodes 730 (see FIG. 7).

The third metal layer M3 is a metal layer disposed on the lower surface of the transparent dielectric substrate 1600 and may include a ground electrode. The third metal layer M3 may be eliminated.

The antenna module according to the embodiment of the present disclosure has the integrated structure of the antenna film and the FPCB that does not require bonding using an anisotropic conductive film (ACF), and accordingly may have the following advantages: The antenna module according to the embodiment of the present disclosure may not require a pad design space or a space for bonding, and thus it is possible to reduce the design margin, compared to an antenna module in which an antenna film with antenna electrodes is attached to a separate FPCB using an anisotropic conductive film (ACF). In addition, the antenna module according to the embodiment of the present disclosure may have no step difference due to the stacking structure of the double films between the antenna film and the FPCB, and can prevent issues such as air bubbles that may occur during a deposition process.

As described above, the antenna 700 of the display device 10 according to the embodiment has the integral structure of the antenna film and the FPCB in which the antenna electrode is formed on the transparent dielectric substrate 1600. The antenna electrode includes the driven element electrode 710 (see FIG. 7), the reflector electrode 720 (see FIG. 7), and the plurality of director electrodes 730 (see FIG. 7). In this instance, the driven element electrode 710 (see FIG. 7) and the reflector electrode 720 (see FIG. 7) are disposed in line with the dead space area DS, which is the non-display area NDA of the display panel 300, and the director electrodes 730 (see FIG. 7) are disposed in line with the display area DA of the display panel 300.

In the display device 10 according to the embodiment of the present disclosure, the antenna electrode for wireless communications may be formed on the same layer as a particular electrode disposed inside the display panel 300 using the same fabrication process as the particular electrode. For example, the driven element electrode 710 (see FIG. 7), the reflector electrode 720 (see FIG. 7), and the director electrodes 730 (see FIG. 7) may be formed on the same layer as the particular electrode using the same fabrication process as the particular electrode. The layer in which the particular electrode may be one of a plurality of TFT electrode layers BPE forming thin-film transistors, a cathode electrode layer CE forming a common electrode, and a sensor electrode layer SENL including a sensor electrode in the display panel 300.

In concluding the detailed description, those skilled in the art will appreciate that many variations and modifications can be made to the example embodiments without substantially departing from the principles of the inventive concept. Therefore, the disclosed embodiments are presented herein for explanation in a generic and descriptive sense only and not for purposes of limitation.

What is claimed is:

1. A display device comprising:
a display panel comprising a display area for displaying images and a non-display area arranged at edges of the display area;
an antenna layer disposed on the display panel and comprising a first area corresponding to the display area, a second area corresponding to the non-display area, and a protruding area protruding from the second area in a first direction away from the display panel; and
an antenna driver circuit electrically connected to the antenna layer through an antenna pad disposed in the protruding area,
wherein the antenna layer comprises:
a feeder electrode disposed on at least a portion of the second area;
a reflector electrode disposed between the feeder electrode and the protruding area in the second area; and
a plurality of director electrodes arranged in at least a portion of the first area and each spaced apart from one another.

2. The display device of claim 1, wherein the antenna pad is disposed at one end of the protruding area in the antenna layer, wherein the protruding area comprises a conductive path electrically connecting the antenna pad with the feeder electrode, and wherein the conductive path is implemented as a substrate integrated waveguide.

3. The display device of claim 2, wherein the conductive path comprises: a feed line configured to supply power to the feeder electrode; and a first ground line and a second ground line disposed on both sides of the feed line, respectively.

4. The display device of claim 3, wherein the reflector electrode comprises a first reflector electrode disposed between one side of the feeder electrode and the first ground line; and a second reflector electrode disposed between an opposite side of the feeder electrode and the second ground line.

5. The display device of claim 3, wherein a center of each of the plurality of director electrodes is located on a straight line extended from the feed line.

6. The display device of claim 3, wherein a center of each of the plurality of director electrodes is located on a straight line inclined by a predetermined angle from a front edge of the feeder electrode.

7. The display device of claim 6, wherein the predetermined angle has a range of +15 degrees to −15 degrees with respect to a straight line extended from the feed line.

8. The display device of claim 1, wherein the director electrodes have an equal length in a second direction perpendicular to the first direction.

9. The display device of claim 1, wherein less than all of the director electrodes selected from among the director electrodes have an equal length in a second direction perpendicular to the first direction.

10. The display device of claim 1, wherein the director electrodes have different lengths in a second direction perpendicular to the first direction; and wherein the director electrodes comprise:

a first director electrode having a first length in the second direction; and a second director electrode disposed between the first director electrode and the feeder electrode and having a second length longer than the first length in the second direction.

11. The display device of claim 1, wherein each of the director electrodes comprises a transparent electrode having a mesh structure.

12. The display device of claim 11, wherein each of the director electrodes comprises a plurality of slots, and each of the plurality of slots overlaps with a pixel arranged in the display panel in a thickness direction of the display panel.

13. The display device of claim 11, wherein the transparent electrode of each of the director electrodes is disposed such that it does not overlap with a pixel arranged in the display panel in a thickness direction of the display panel.

14. The display device of claim 1, wherein the antenna layer comprises a transparent dielectric substrate disposed on the display panel, and the feeder electrode, the reflector electrode and the director electrodes are disposed on an upper surface of the transparent dielectric substrate.

15. The display device of claim 14, further comprising a ground electrode disposed on a lower surface of the transparent dielectric substrate.

16. An antenna module disposed inside a display device, comprising:

a transparent dielectric substrate disposed on a display panel of the display device; and an antenna electrode disposed on an upper surface of the transparent dielectric substrate, wherein the antenna electrode comprises:

a feeder electrode and a reflector electrode, each overlapping a non-display area of the display panel in a thickness direction of the display panel; and a plurality of director electrodes each overlapping a display area of the display panel in the thickness direction.

17. The antenna module of claim 16, wherein the transparent dielectric substrate comprises: a first area overlapping the display area in the thickness direction, a second area overlapping the non-display area in the thickness direction, and a protruding area protruding from the second area in a direction away from the display panel and comprising an antenna pad, and wherein a conductive path for supplying power to the feeder electrode is disposed on the protruding area of the transparent dielectric substrate.

18. The antenna module of claim 17, wherein the conductive path is implemented as a substrate integrated waveguide.

19. The antenna module of claim 17, wherein a center of each of the plurality of director electrodes is located on a straight line extended from the feed line of the conductive path.

20. The antenna module of claim 17, wherein a center of each of the plurality of director electrodes is located on a straight line inclined by a predetermined angle from the feeder electrode.

* * * * *